United States Patent
Suzuki et al.

(10) Patent No.: US 6,218,022 B1
(45) Date of Patent: *Apr. 17, 2001

(54) RESIN ETCHING SOLUTION AND PROCESS FOR ETCHING POLYIMIDE RESINS

(75) Inventors: Atushi Suzuki, Saitama; Mayumi Aimoto, Kawagoe; Takashi Kubota, Kamakura; Masanori Akita; Koji Itoh, both of Otsu, all of (JP)

(73) Assignee: Toray Engineering Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/925,907

(22) Filed: Sep. 9, 1997

(30) Foreign Application Priority Data

Sep. 20, 1996 (JP) .................................................. 8-271676
Jan. 10, 1997 (JP) .................................................. 9-014627

(51) Int. Cl.[7] .................................................. B32B 15/04
(52) U.S. Cl. .............................. 428/457; 216/64; 216/73; 216/93; 428/330
(58) Field of Search .................................. 156/655, 904, 156/668, 659.1, 79.5; 216/93, 73, 64, 105; 428/457, 473.4, 473.1, 330

(56) References Cited

U.S. PATENT DOCUMENTS

| 3,395,057 |   | 7/1968 | Fick . |       |
|-----------|---|--------|--------|-------|
| 4,426,253 | * | 1/1984 | Kreuz et al. | 156/668 |
| 4,857,143 |   | 8/1989 | Glenning et al. . |  |
| 5,502,143 | * | 3/1996 | Oie et al. | 156/668 |

FOREIGN PATENT DOCUMENTS

| 0 404 049 | 12/1990 | (EP) . |
| 55-160031 | 12/1980 | (JP) . |
| 63-085602 | 4/1988 | (JP) . |
| 3-101228 | 4/1991 | (JP) . |
| 03292337 | 12/1991 | (JP) . |
| 04020539 | 1/1992 | (JP) . |
| 5-202206 | 8/1993 | (JP) . |
| 5-301981 | 11/1993 | (JP) . |
| 7-157560 | 6/1995 | (JP) . |
| 7221457 | 8/1995 | (JP) . |
| 863718 | 9/1981 | (SU) . |
| 1680142 | 9/1991 | (SU) . |

* cited by examiner

Primary Examiner—Merrick Dixon
(74) Attorney, Agent, or Firm—Burns, Doane, Swecker & Mathis, L.L.P.

(57) ABSTRACT

A resin etching solution containing a hydroxyalkylamine, an alkali metal compound and water, or an aliphatic alcohol, an aliphatic amine, an alkali metal compound and water, and a process for etching a polyimide film containing a resist pattern or metal layer pattern formed on either or both sides using the resin etching solution.

10 Claims, 4 Drawing Sheets

RESIN ETCHING SOLUTION AND PROCESS FOR ETCHING POLYIMIDE RESINS

BACKGROUND OF THE INVENTION

1. Field of the Invention

The present invention relates to a resin etching solution and an etching process.

2. Description of the Related Art

Polyimide resins which have excellent characteristics including heat resistance and electrical insulating properties are widely used in the field of electronics. They are used, for example, for flexible printed boards and TAB tapes.

Polyimide resins are used in various forms including films, sheets and coating agents; when used as films they are not always in simple form, but often have copper foils attached to their film surfaces with adhesives or are plated with copper sputtering-copper electrolytes, or are in the form of laminates, with the polyimide resin casted or coated on a copper foil.

Thus, a large number of such substrates are marketed by companies in the field. As representative examples of simple polyimide films there may be mentioned Kapton (tradename of DuPont Co., U.S.), Upilex S or R (tradename of Ube Industries, Ltd.) and Apical (tradename of Kanegafuchi Chemicals, K.K.).

As representative examples of products with polyimide resins cast molded on copper foils there may be mentioned Neoflex (tradename of Mitsui-Toatsu Chemicals, K.K.) and Espanex (tradename of Shinnittetsu Chemicals, K.K.).

A representative example of a coating agent is Torayneece (tradename of Toray, K.K.), and representative examples of polyimide bonding sheets are UPA (tradename of Ube Industries, Ltd.) and SPB (tradename of Shinnittetsu Chemicals, K.K.).

Among the polyimide resins used in these various forms, those polyimide films used as circuit board bases are provided with throughholes and device holes which are usually formed by chemical etching methods carried out using alkali-hydrazine-based etching solutions.

However, since such hydrazine-based etching solutions have toxicity (carcinogenicity) and short usable lives, great care must be taken in handling them, and thus the setting of ideal conditions for the etching has presented constant difficulties.

Also, in the case of panels which are laminates of polyimide films and copper foils, when etching is performed on the polyimide films using the patterned copper foils as masks, hydrazine-based etching solutions easily filter through interfaces with the copper foil masks and the polyimide films, and therefore peeling occurs between the copper foil and polyimide film before the throughholes (etching holes) are formed in the polyimide film by etching, resulting in a disadvantage in that it becomes difficult to form etching holes of the desired shape.

Another etching solution used is the one disclosed in Japanese Examined Patent Publication No. 60-14776, for example, which comprises urea and an alkali metal compound; however, this etching solution has a much slower etching rate and results in more destruction of the etching hole pattern (flawed shape and dimensions) than in the case described above, and when the etching temperature is increased for a higher etching rate the urea decomposes producing ammonia which has a strongly irritating odor, and resulting in environmental sanitation problems.

Furthermore, etching solutions comprising alkali metal compounds, phenolic solvents and water, as well as etching compositions prepared by adding either water or alcohol to alkali metal compounds, phenolic solvents and amine compounds, have been publicly known (being disclosed, for example, in Japanese Unexamined Patent Publication No. 5-301981).

However, even though all of these conventional etching solutions can be used for etching of polyimide films obtained by polycondensation of pyromellitic dianhydride and aromatic diamines (for example, the aforementioned Kapton and Apical), they have a crucial weakness in that they are poorly suitable for etching of polyimide films obtained by polycondensation of biphenyltetracarboxylic dianhydride and diaminobenzene, such as Upilex S (tradename of Ube Industries, Ltd.), which have excellent heat resistance, form stability and chemical resistance and are thus better suited for minute circuit pattern formation, compared to the former type of polyimide films.

For this reason, when miniature throughholes 200 microns or less in diameter are formed, for example, in double-layer polyimide films consisting of copper foils and Upilex S, such as Metaloyal (tradename of Toyo Metallizing, K.K.), the working must by necessity be accomplished with a costly excimer laser, and therefore a solution to this situation has been strongly desired.

In response to this need there have been proposed an etching solution comprising hydrazine monohydrate and potassium hydroxide, disclosed in Japanese Unexamined Patent Publication No. 3-101228 and an etching solution comprising sodium hydroxide, ethylenediamine, hydrazine monohydrate, aqueous dimethylamine and N,N-dimethylformamide, disclosed in Japanese Unexamined Patent Publication No. 5-202206.

However, none of these are fully satisfactory, and for example in the case of the aforementioned Metaloyal which has a pattern formed on the copper foil, when the copper foil is used as a mask for etching of the polyimide film, peeling occurs between the copper foil and polyimide film and therefore satisfactory etching holes (throughholes) without pattern destruction cannot be obtained.

Also, even though dimethylformamide solutions containing ethanolamine, disclosed for example in Japanese Unexamined Patent Publication No. 7-157560 under paragraph [0068], can be applied to polyimide resins which are soluble in organic solvents, they cannot be used for Kapton and Upilex, both of which are polyimide resins insoluble in organic solvents.

SUMMARY OF THE INVENTION

The present invention was accomplished in the light of these circumstances, and is the result of diligent research aimed at providing an etching solution which is suitable naturally for etching of polyimide resins obtained by polycondensation of pyromellitic dianhydride and aromatic diamines, but also for etching of polyimide resins obtained by polycondensation of biphenyltetracarboxylic dianhydride and diaminobenzene, as well as an etching process which can accomplish rapid and satisfactory etching of films composed of such resins; the present invention has been completed upon the discovery of an etching solution containing at least a hydroxyalkylamine, an alkali metal compound and water, or at least an aliphatic alcohol, an aliphatic amine, an alkali metal compound and water.

In other words, the present invention provides a resin etching solution comprising a hydroxyalkylamine, an alkali metal compound and water.

The present invention further provides a resin etching solution comprising an aliphatic alcohol, an aliphatic amine, an alkali metal compound and water.

DESCRIPTION OF THE PREFERRED EMBODIMENTS

Figure 1:
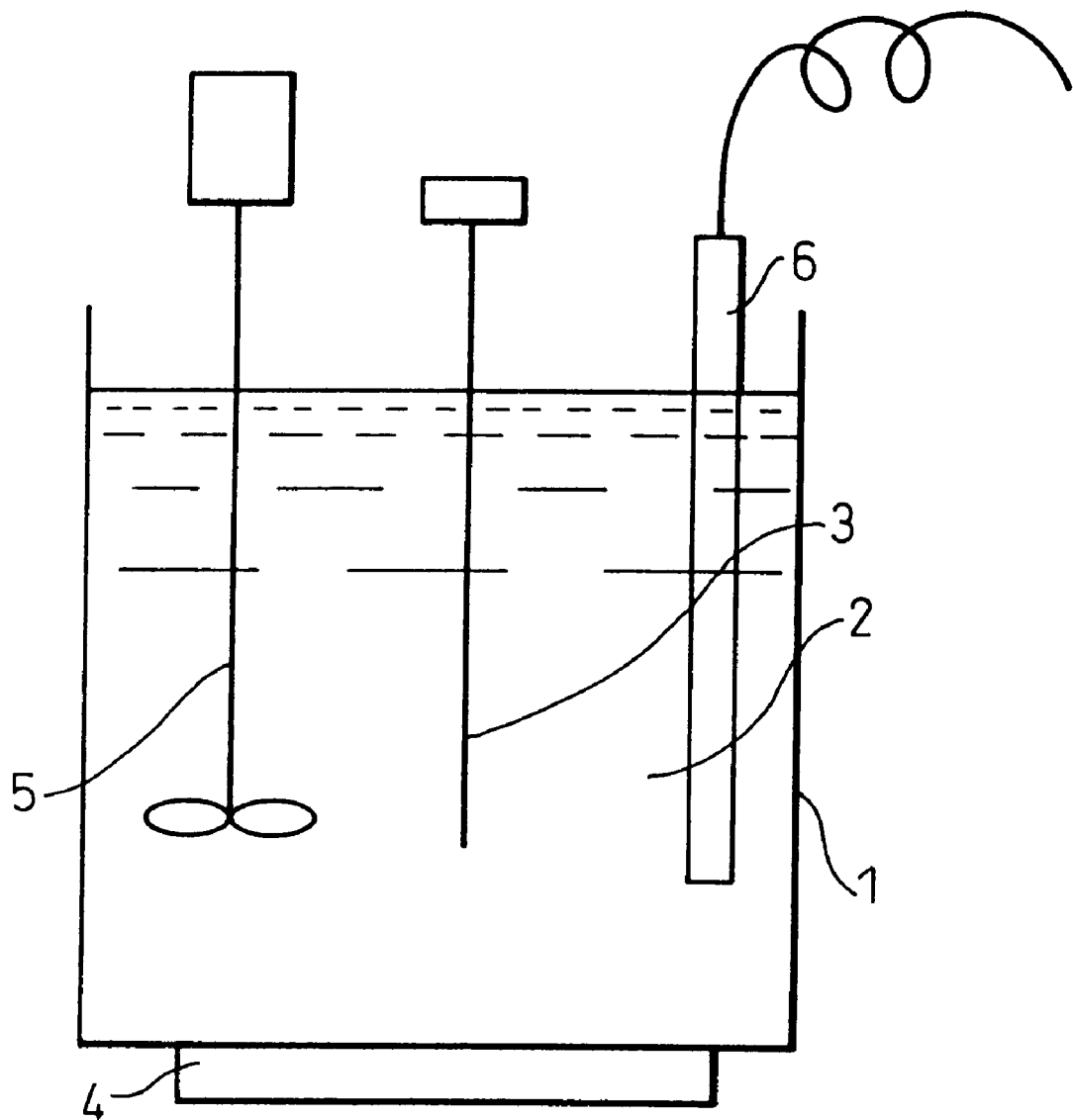
FIG. 1 shows an embodiment of etching with an ultrasonic wave system.

The resin etching solution according to the first aspect of the invention comprises a hydroxyalkylamine, an alkali metal compound and water, and the hydroxyalkylamine is a water-soluble primary or secondary amine with an amino group and an alcoholic hydroxyl group in the same molecule, or a mixture of the primary and secondary amines.

As primary amines there may be mentioned ethanolamine, propanolamines such as n-propanolamine or isopropanolamine, butanolamines such as n-butanolamine or 2-amino-1-butanol, and N-(β-aminoethyl)ethanolamine.

These are preferred because they allow economical etching rates and can prevent destruction of the etching hole patterns, wherein the etching holes may be circular, rectangular or of any other shape.

As secondary amines there may be mentioned diethanolamine, dipropanolamine, N-methylethanolamine and N-ethylethanolamine. Although these have poorer etchability on polyimide resins with excellent chemical resistance such as Upilex S, they can be satisfactorily used for pyromellitic acid-based polyimide resins such as Kapton.

Thus, primary and secondary amines are used instead of tertiary amines with alcoholic hydroxyl groups, such as triethanolamine or tripropanolamine, because the latter do not give economical etching rates and often result in swelling of the polyimide resin and generation of minute cracks.

The concentration of the hydroxyalkylamine may be 4%–70%, and preferably 5%–40%, based on the aqueous etching composition solution. A hydroxyalkylamine concentration which is too low results in a reduced etching rate, while a concentration exceeding 70% lowers the concentration of the other essential component, the alkali metal compound, and also lowers the etching rate.

In addition, the alkali metal compound is most preferably potassium hydroxide from the standpoint of an economical etching rate, but other substances such as sodium hydroxide and lithium hydroxide may also be used, and they may be used alone or in admixture.

Also, they may be used in concentrations of from 5% to saturation at the temperature used; a lower concentration is not preferred as it can result in a slower etching rate and more destruction of the etching hole pattern (flawed shape and dimensions), while conversely a high concentration can result in blockage of pipes at lower temperatures, and therefore a concentration of about 10%–48% is preferred. Generally, 20%–45% is more preferred for an economical etching rate and to prevent destruction of etching hole patterns.

The etching temperature must be appropriately selected depending on the type of polyimide resin for etching. It is generally in the range of from 20° C. to the boiling point of the system, and preferably 30° C.–90° C.

When the polyimide film is to be etched on one side, the difference in diameter on the upper and lower sides of the punched etching hole will tend to produce a taper, and addition of urea is effective for reducing the degree of taper.

The etching rate will not be affected even when urea is added. Also, its minimized decomposition helps reduce the ammonium odor. This is because the etching solution of the invention which employs the hydroxyalkylamine can be used under more temperate conditions than conventional hydrazine-based etching solutions.

Also, addition and mixture of an organic polar solvent to the etching solution is preferred when necessary as it can result in smoother etching hole walls and help to remove the etching residue. A suitable organic polar solvent is N-methyl-2-pyrrolidone (NMP). Urea and an organic polar solvent may both be added as well.

The resin etching solution according to the second aspect of the invention comprises an aliphatic alcohol, an aliphatic amine, an alkali metal hydroxide compound and water, and as aliphatic alcohols there may be used monohydric alcohols such as methyl alcohol, ethyl alcohol, propyl alcohol, butyl alcohol and cyclohexanol; methoxyethanol, ethylene glycol monomethyl ether and isomers thereof, as well as ethylene glycol, propylene glycol, trimethylene glycol, butylene glycol, tetramethylene glycol, pentamethylene glycol, diethylene glycol, triethylene glycol and polyethylene glycols of molecular weight up to about 500.

These aliphatic alcohols preferably have higher boiling points than the etching temperature in order to ensure maintenance and stability of the solution composition, and the number of carbon atoms is preferably lower in order avoid reducing the concentration of other components in the etching solution while maintaining a constant hydroxyl concentration in the etching solution. Ethylene glycol and propylene glycol are preferred from this standpoint, while methanol and ethanol, though having low carbon numbers, also have low boiling points and are therefore not preferred for etching of polyimide films with high chemical resistance, such as the aforementioned Upilex S.

These aliphatic alcohols have the effect of improving the etching rate even when present in small amounts, but their effect is minimal if added at under 1%, while their admixture at greater than 40% is not preferred since it lowers the concentration of the other effective components, thus reducing the etching effect. From this standpoint, they are used in a range of 1%–40%, and most preferably 5%–30%.

The aliphatic amine used may be a monovalent amine which includes primary amines such as n-butylamine, amylamine and hexylamine, secondary amines such as diethylamine, dipropylamine, diisopropylamine and dibutylamine, and tertiary amines such as triethylamine, tripropylamine and tributylamine; or a divalent amine which includes ethylenediamine, triethylenediamine, tetramethyldiamine, pentamethylenediamine and hexamethylenediamine.

In addition, a water-soluble primary or secondary amine with an alcoholic hydroxyl group in the same molecule, such as a hydroxyalkylamine, or a mixture of the primary and secondary amines, may also be added. Such primary and secondary amines with a hydroxyl group include ethanolamine, propanolamines such as n-propanolamine or isopropanolamine, butanolamines such as n-butanolamine or 2-amino-1-butanol, and N-(β-aminoethyl)ethanolamine, diethanolamine, dipropanolamine, N-methylethanolamine and N-ethylethanolamine.

The best etchability is achieved with systems using monovalent or divalent aliphatic primary amines, and they are preferred because they provide more economical etching rates for forming throughholes of prescribed dimension and shape in polyimide films with high chemical resistance, such as the aforementioned Upilex S on which metal patterns are formed.

There is also no problem with using a hydroxyalkylamine with the structures of an aliphatic alcohol and aliphatic amine in the same molecule, to constitute part of the aliphatic alcohol or aliphatic amine.

On the other hand, in the case of polyimide films which are more easily etched, such as the aforementioned Kapton or Apical, the object may be sufficiently achieved by adding an aliphatic secondary amine to an aliphatic primary amine, or with an aliphatic secondary amine alone. Tertiary amines are not preferred because they do not give economical etching rates even with Kapton or Apical, and also cause swelling and minute cracking in the polyimide resin.

The concentration of the aliphatic amine may be 8%–70%, and preferably 10%–40% based on the aqueous etching composition solution. If the concentration of the aliphatic amine is too low the etching rate is lowered, and if it exceeds 70% the concentration of the other essential component, the alkali metal compound, is reduced and the etching rate is lowered.

In addition, the alkali metal compound is most preferably potassium hydroxide from the standpoint of an economical etching rate, but other substances such as sodium hydroxide and lithium hydroxide may also be used, either alone or in admixture.

Also, they may be used in concentrations of from 5% to saturation at the temperature used; a lower concentration is not preferred as it can result in a slower etching rate and more destruction of the etching hole pattern (flawed shape and dimensions), while conversely a high concentration can result in blockage of pipes at lower temperatures, and therefore a concentration of about 10%–48% is preferred. Generally, 20%–45% is more preferred for an economical etching rate and to prevent destruction of etching hole patterns.

The etching temperature must be appropriately selected depending on the type of polyimide resin for etching. It is generally in the range of from 20° C. to the boiling point of the system, and preferably 30° C.–90° C. When the polyimide film is to be etched on one side, the difference in diameter on the upper and lower sides of the punched etching hole will produce a taper, and addition of urea is effective for reducing the degree of taper. The etching rate will not be affected even when urea is added.

Also, addition and mixture of an organic polar solvent is preferred when necessary as it can result in smoother etching hole walls and help to remove the etching residue. A suitable organic polar solvent is N-methyl-2-pyrrolidone (NMP). Urea and an organic polar solvent may both be added as well.

The above-mentioned resin etching solutions of the invention may be used not only for films but also for polyimide resins in any other form, although it is preferably used for films. If necessary, it may also be used for resins other than polyimide resins but polyimide resins are preferred, and it is particularly preferred to select polyimide resins with excellent heat resistance, form stability and chemical resistance such as the aforementioned Upilex S, which are obtained by polycondensation of biphenyltetracarboxylic dianhydride or esters thereof and diaminobenzene, i.e. polyimide resins whose etching has been difficult with conventional hydrazine-based etching solutions and alkali-urea-based etching solutions.

Nevertheless, the other polyimide resins such as polyimide resins obtained by polycondensation of pyromellitic dianhydride and aromatic diamines (for example, Kapton and Apical mentioned above) may be preferred because they allow more satisfactory etching under temperate conditions in a shorter time compared to etching with the above-mentioned conventional etching solutions.

Polyimide films etched using a resin etching solution according to the invention may be polyimide films with resist patterns formed on both sides or on either side, or polyimide films with resist patterns and metal layer patterns of the same shape formed on both sides or on either side.

Specifically, in the former case the polyimide film may be used with a resist pattern formed directly on the film surface, and in the latter case the polyimide film may be used with a resist pattern formed on the film surface via a metal layer of copper or the like; however, in either case the exposed film sections are etched to form prescribed etching holes.

Here, it is preferred for the polyimide film immersed in the resin solution to be etched with irradiation of ultrasonic waves, or for the etching solution to be injected through a nozzle (preferably a spray nozzle) at the etching sites. This is because etching by these methods helps to shorten the etching time and simplify formation of intricate patterns.

The etching is preferably performed in a solution in order to avoid deterioration of the etching solution, and in the case of an ultrasonic wave system, the object to be etched may be immersed in an etching solution in a treatment tank equipped with an ultrasonic oscilator in addition to an agitating apparatus such as a propeller system or jet system. The ultrasonic irradiation may be carried out alone, but ultrasonic irradiation and agitation are most preferably carried out together.

In the case of a nozzle system, the object to be etched is preferably immersed in an aqueous etching solution in a treatment tank equipped with a spray nozzle, to spray the etching solution at a pressure of at least 0.5 kg/cm$^2$ through the nozzle onto the etching sites.

FIG. 1 shows an embodiment of etching with an ultrasonic wave system, wherein an object to be etched 3 (such as a polyimide film strip) is immersed in an etching solution 2 in a treatment tank 1 and bombarded with ultrasonic waves with an ultrasonic wave vibrator 4 mounted at the bottom of the tank. The etching solution 2 is heated with a heater 6 and agitated with a propeller agitator 5 while maintaining a constant solution temperature.

Figure 2:
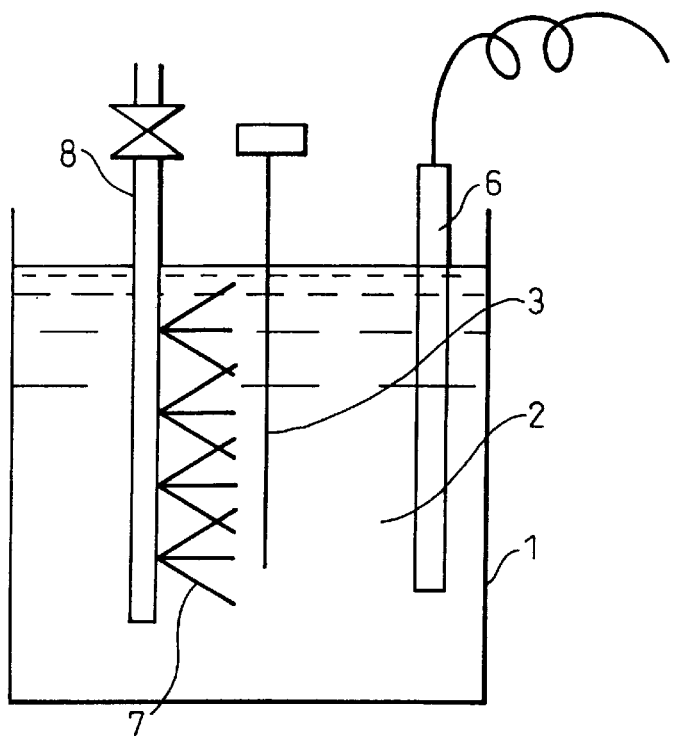
FIG. 2 shows an embodiment of etching with a spray system.

FIG. 2 shows an embodiment of etching with a spray nozzle system, wherein an object to be etched 3 (such as a polyimide film strip) is immersed in an etching solution 2 in a treatment tank 1 and the etching solution is sprayed by pump pressure onto the object to be etched 3 through a nozzle 7 mounted on a spray solution supply pipe 8 immersed in the etching solution 2.

Thus, the resin etching solution of the invention may be used for satisfactory etching of polyimide resins of different forms. For example, it may be suitably applied to semiconductor packages with metal bases. Such semiconductor packages are provided with electromagnetic shielding for good heat release properties when mounted, to provide suitability for high density mounting conditions, and they consist of mounted semiconductor chips, semiconductor circuits, multiple external terminals and metal panels coated with insulating layers at the necessary locations, with formation of one or more insulating layers and with conducting circuits formed on each insulating layer.

Polyimide films are therefore well suited as materials for the construction of each of the insulating layers, and while throughholes and via holes must be provided, the resin etching solution of the invention allows economical etching to be performed while preventing destruction of the throughhole patterns.

Also in the case of printed wiring circuit boards which comprise semiconductor circuits, multiple external terminals and insulating layers, one or more insulating layers are provided with conductor circuits formed on each insulating layer, for which polyimide films are suited as the constituent materials; here as well, the resin etching solution of the invention allows economical etching while preventing destruction of the throughhole pattern.

As is well known, high-density mounting printed wiring circuit boards are produced by various methods; that is, they are produced by methods such as heat transfer of intricate wiring patterns formed by electrolytic plating on conductor panels from those conductor panels to insulating layers made of polyimide films formed on metal sheets, or formation of wiring patterns by photoetching onto copper foils of panels which have copper foils pasted onto insulating layers formed on metal sheets, or formation of wiring patterns by photoplating onto copper foil films formed by sputtering on insulating layers formed on metal sheets; however, the resin etching solution of the present invention allows satisfactory etching of the polyimide films used for these purposes as well, in the same manner as described above.

In addition, polyimide films obtained from biphenyltetracarboxylic dianhydride and diaminobenzene, which have excellent heat resistance, form stability and chemical resistance, such as the aforementioned Upilex S, are suitable as materials for making the insulating layers of TAB tapes which have one or more insulating layers with conductor circuits formed on each insulating layer; moreover, their excellent strong rigidity and form stability even when in the form of thin-films of 75 microns or less are becoming important features with the development of intricately worked patterns, and here as well, the resin etching solution of the invention is capable of etching these polyimide films and therefore can economically perform difficult etching of throughholes and device holes while preventing destruction of the patterns.

The present invention will be further illustrated below with reference to the following non-limitative examples.

EXAMPLE 1

Figure 3:
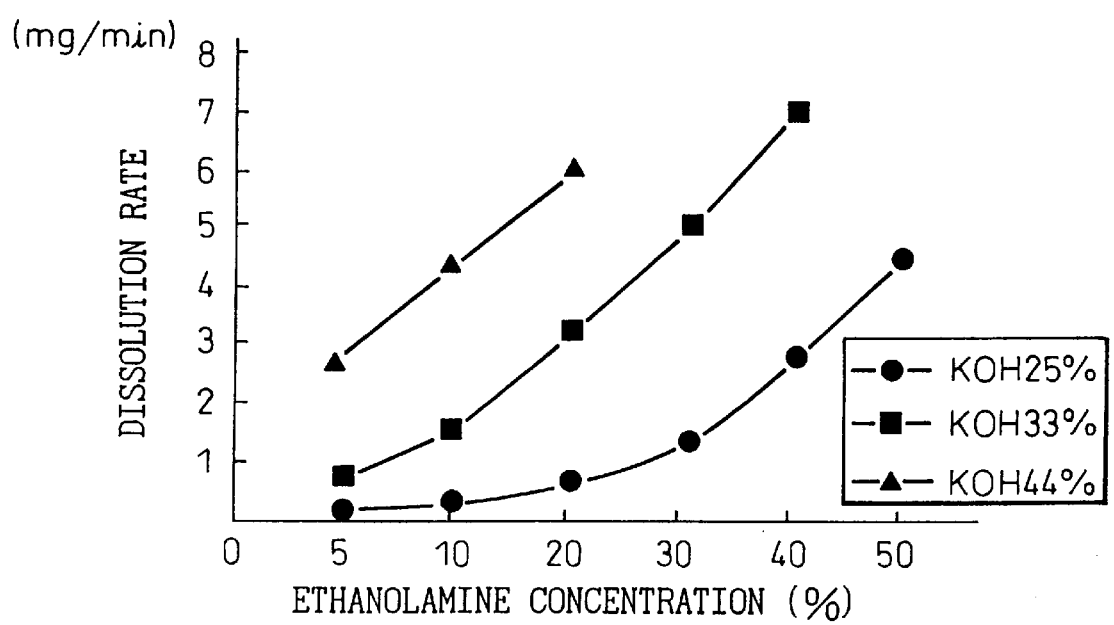
FIG. 3 is a graph showing the relationship between potassium hydroxide and ethanolamine concentrations and the dissolution rate of polyimide films.

A 10 mm×5 mm strip was prepared from a 50 μm-thick polyimide film produced by Ube Industries, Ltd., i.e. Upilex S and was etched in 100 g of etching solution containing ethanolamine and potassium hydroxide. The dissolution rate of the strip was measured with varying concentrations of the potassium hydroxide and ethanolamine in the etching solution, and the results are shown in FIG. 3.

With an ethanolamine concentration of 3%, the Upilex S did not dissolve, but at 5% it began to dissolve with virtually no swelling, resulting in reduction of the film thickness. Also, the dissolution rate increased with higher concentrations of potassium hydroxide and ethanolamine.

EXAMPLES 2–4

The copper foil surface of a Metaloyal film produced by Toyo Metallizing, K.K. (50 micron-thick polyimide film produced by Ube Industries, Ltd., i.e. Upilex S, with an 8 micron copper foil formed on one side) was coated with a 7 micron positive resist PMER produced by Tokyo Oka Co., dried, and subjected to ultraviolet exposure and alkali development to produce a resist pattern with holes 150 microns in diameter arranged at spacings of 200 microns.

Next, the exposed sections of the copper foil were etched with an etching solution containing ferric chloride to form a copper foil pattern of the same shape as the resist pattern. Also, PET-based masking tape was attached to the surface of the Metaloyal film with no copper foil, and then an etching solution with a different concentration was used for polyimide etching at 80° C. The results are shown in Table 1 below.

TABLE 1

| Example | Solution composition (wt %) | | | Time (min) | Results |
| --- | --- | --- | --- | --- | --- |
| | E · A | KOH | Water | | |
| 2 | 20 | 40 | 40 | 20 | holes with considerable tapering |
| 3 | 33 | 33 | 34 | 13 | satisfactory holes |
| 4 | 50 | 25 | 25 | 20 | same as above |

Note: E · A = ethanolamine

EXAMPLE 5

Etching was performed under the same conditions as Example 3, except that isopropanolamine was used instead of ethanolamine, and this resulted in obtaining satisfactory etching holes.

EXAMPLE 6

Both copper foil surfaces of an Etch-A-flex sheet produced by Mitsui-Toatsu Chemicals, K.K. (product of 125 micron-thick Kapton V film produced by U.S. DuPont Inc. with 18 micron copper foil formed on both sides) was coated with a positive resist PMER produced by Tokyo Oka Co., dried, and subjected to ultraviolet exposure and alkali development to produce a resist pattern with holes 150 microns in diameter arranged at spacings of 200 microns. The exposed sections of the copper foil were then etched with an etching solution containing ferric chloride to form a copper foil pattern of the same shape as the resist pattern.

The Etch-A-flex film having the aforementioned pattern formed thereon was immersed in an etching solution comprising 50% diethanolamine, 25% potassium hydroxide and 25% water at 60° C. for 5 minutes while agitating, and etched throughholes with satisfactory edges were obtained having the same dimensions and same shape as the copper pattern.

EXAMPLE 7

Etching was performed under the same conditions as Example 6, except that dipropanolamine was used instead of diethanolamine, and this resulted in obtaining etched throughholes with satisfactory edges having the same dimensions and same shape as the copper pattern.

EXAMPLE 8

The aforementioned Metaloyal film as used in Examples 2–4) was etched at 80° C. for 20 minutes using an etching solution comprising 50% ethanolamine, 25% potassium hydroxide and 25% water, and using an etching apparatus equipped with an ultrasonic wave vibrator, by which etched throughholes with satisfactory edges were obtained having the same dimensions and same shape as the copper pattern.

EXAMPLE 9

An Etch-A-flex film prepared under the same conditions as Example 6 was set in an etching apparatus equipped with an ultrasonic wave vibrator, and an etching solution comprising 50% ethanolamine, 25% potassium hydroxide and 25% water was used for etching at 80° C. for 3 minutes, to obtain etched throughholes with satisfactory edges having the same dimensions and same shape as the copper pattern.

EXAMPLE 10

Etching was performed under the same conditions as Example 9, except that the etching solution used comprised 30% ethanolamine, 17% potassium hydroxide, 16% N-methylpyrrolidone, 20% urea and 17% water for etching at 70° C. for 8 minutes, by which etched throughholes of satisfactory shape were obtained.

EXAMPLE 11

Etching was performed under the same conditions as Example 9, except that the etching solution used comprised 36% ethanolamine, 24% urea, 20% potassium hydroxide and 20% water for etching at 70° C. for 6 minutes and 30 seconds, by which etched throughholes of satisfactory shape were obtained.

Comparative Example 1

Etching was performed under the same conditions as Example 4, except that hydrazine was used instead of ethanolamine. Treatment for 20 minutes resulted in peeling between the copper foil and polyimide film, and although the polyimide film was also etched, etched throughholes of the prescribed shape were not achieved.

When the etching time was shortened to 4 minutes, peeling still occurred between the copper foil and polyimide film, but the polyimide film was not etched. Etching was performed in this manner with various temperatures and times, but no conditions were found which could give satisfactory etched throughholes.

Comparative Example 2

Etching was performed under the same conditions as Example 4, except that the etching solution described in Example 3 of Japanese Unexamined Patent Publication No. 3-101228, i.e. hydrazine monohydrate/potassium hydroxide=100/18.7 (parts by weight) was used as the etching solution, and this resulted in peeling between the copper foil and polyimide film and dissolution of the polyimide at sections other than the pattern, while no conditions were found which could satisfactorily create throughholes in the polyimide film.

Comparative Example 3

Etching of the Metaloyal film prepared in Example 2 with a pattern formed on the copper foil surface was performed at 75° C. using the etching solution described in Example 4 of Japanese Unexamined Patent Publication No. 5-202206, i.e. an etching solution containing 70 vol % of a 40% aqueous sodium hydroxide solution, 8 vol % of hydrazine monohydrate, 22 vol % of ethylenediamine, 12 vol % of a 20% aqueous dimethylamine solution and 12 vol % of N,N-dimethylformamide, but no conditions were found which could satisfactorily create throughholes in the polyimide film without causing peeling between the copper foil and the polyimide film.

Comparative Example 4

Etching of the Metaloyal film prepared in Example 2 with a pattern formed on the copper foil surface was performed at 80° C. under the same conditions as Example 4 except that the diethanolamine was replaced with urea. The interface between the polyimide film and copper foil pattern began to peel after 30 minutes of etching, but no etching was achieved. Also, after 45 minutes the peeling progressed but without sufficient etching of the polyimide film, so that satisfactory throughholes could not be created in the polyimide film.

EXAMPLES 12–15

A 10 mm×5 mm strip was prepared from a 50 µm-thick polyimide film produced by Ube Industries, Ltd. (Upilex S) and was etched in 100 g of an aqueous etching solution containing ethylenediamine, ethylene glycol and potassium hydroxide. The dissolution rate of the strip was measured with varying molar ratios of the potassium hydroxide, ethylenediamine and ethylene glycol in the etching solution. The results are shown in Table 2.

TABLE 2

| | Example | | | |
| --- | --- | --- | --- | --- |
| | 12 | 13 | 14 | 15 |
| Additive | Composition (wt %) | | | |
| potassium hydroxide | 33.5 | 33.5 | 33.5 | 33.5 |
| water | 33.5 | 33.5 | 33.5 | 33.5 |
| ethylenediamine | 22.0 | 16.5 | 11.0 | 33.0 |
| ethylene glycol | 11.0 | 16.5 | 22.0 | 0 |
| polyimide dissolution rate (µm/min · 80° C.) | 3.7 | 7.0 | 8.8 | 7.0 |

EXAMPLES 16–19

The copper foil surface of a Metaloyal film produced by Toyo Metallizing, K.K. (50 micron-thick polyimide film produced by Ube Industries, Ltd., i.e. Upilex S, with an 8 micron copper foil formed on one side) was coated with a 7 micron positive resist PMER produced by Tokyo Oka Co., dried, and subjected to ultraviolet exposure and alkali development to produce a resist pattern with holes 150 microns in diameter arranged at spacings of 200 microns.

Next, the exposed sections of the copper foil were etched with an etching solution containing ferric chloride to form a copper foil pattern of the same shape as the resist pattern. Also, PET-based masking tape was attached to the surface of the Metaloyal film surface with no copper foil, and then the etching solutions of Examples 12–15 above were used for etching at 80° C. for 15 minutes. The results are shown in Table 3.

The SEM (scanning electron microscope) photographs (×100) of the etched films are shown in FIGS. 4–7.

TABLE 3

Figure 4:
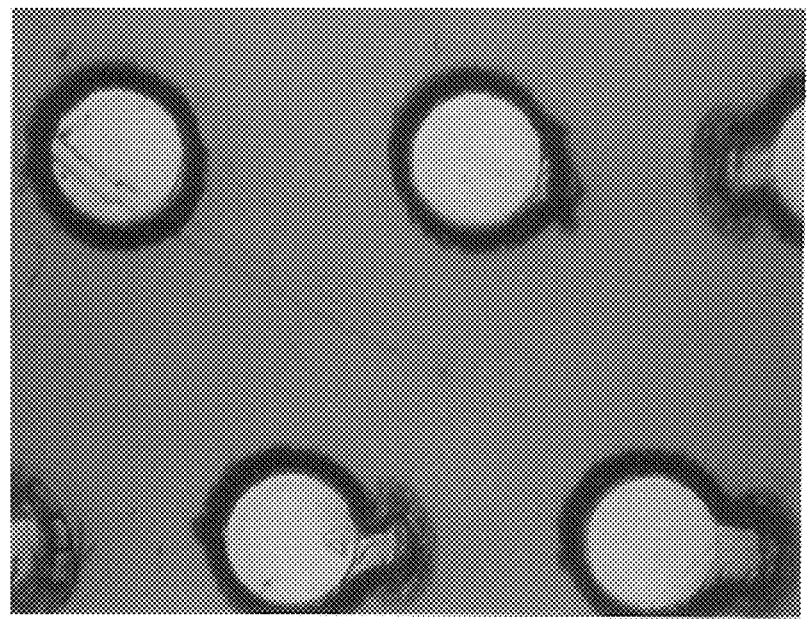
FIG. 4 is an SEM photograph showing the etched state in Example 16.
Figure 5:
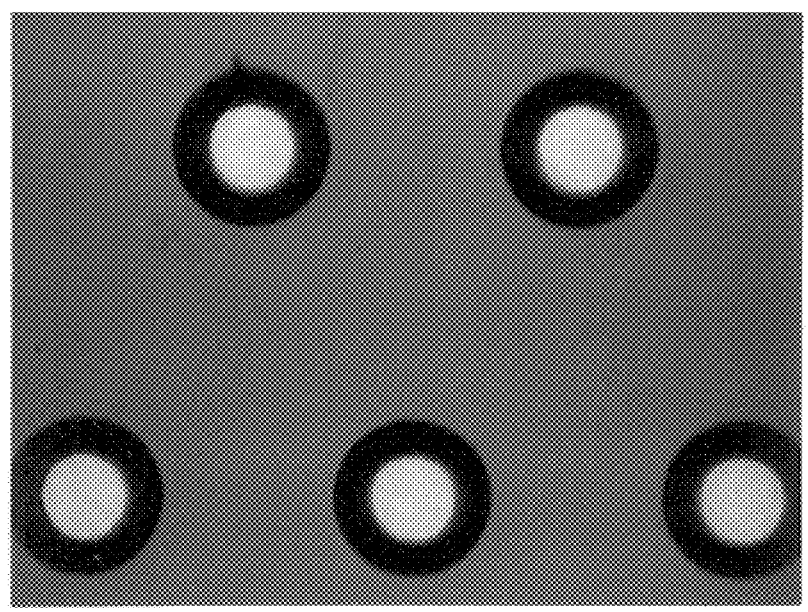
FIG. 5 is an SEM photograph showing the etched state in Example 17.
Figure 6:
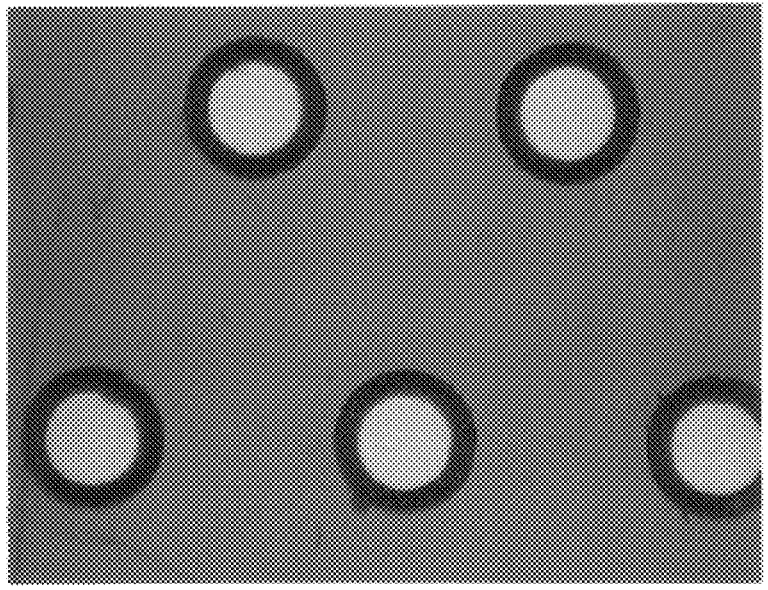
FIG. 6 is an SEM photograph showing the etched state in Example 18.
Figure 7:
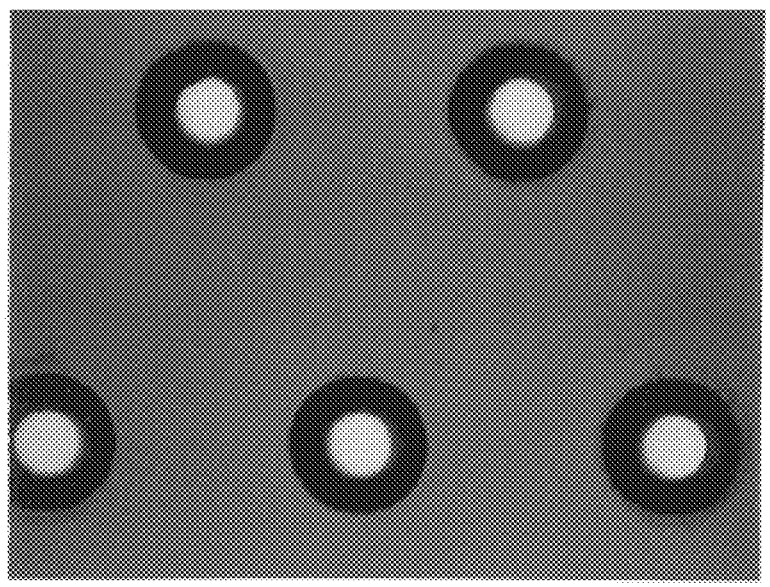
FIG. 7 is an SEM photograph showing the etched state in Example 19.

| Example | 16 | 17 | 18 | 19 |
|---|---|---|---|---|
| Solution composition | Example 12 | Example 13 | Example 14 | Example 15 |
| Etching effect | peeling between copper/Pi | satisfactory throughholes | satisfactory throughholes | peeling between copper/Pi |
| Figure | FIG. 4 | FIG. 5 | FIG. 6 | FIG. 7 |

EXAMPLE 20

Etching was performed under the same conditions as Example 14, except that trimethylenediamine was used instead of ethylenediamine, and this resulted in obtaining satisfactory etching holes.

EXAMPLE 21

Both copper foil surfaces of an Etch-A-flex sheet produced by Mitsui-Toatsu Chemicals, K.K. (product of 125 micron-thick Kapton V film produced by U.S. DuPont Inc. with 18 micron copper foil formed on both sides) were coated with a positive resist PMER produced by Tokyo Oka Co., dried, and subjected to ultraviolet exposure and alkali development to produce a resist pattern with holes 150 microns in diameter arranged at spacings of 200 microns. The exposed sections of the copper foil were then etched with an etching solution containing ferric chloride to form a copper foil pattern of the same shape as the resist pattern.

The Etch-A-flex film having the aforementioned pattern formed thereon was immersed in an etching solution comprising 16.5% pentamethylenediamine, 16.5% ethylene glycol, 33% potassium hydroxide and 34% water for etching at 80° C. for 4 minutes while agitating, and etched throughholes with satisfactory edges were obtained having the same dimensions and same shape as the copper pattern.

EXAMPLE 22

Etching was performed under the same conditions as Example 21, except that ethylenediamine and triethylene glycol were used at 80° C. for 10 minutes, and this resulted in obtaining etched throughholes with satisfactory edges having the same dimensions and same shape as the copper pattern.

Comparative Example 5

The etching solution described under [0039] of Japanese Unexamined Patent Publication No. 5-301981, i.e. a solution with a composition of 30 wt % sodium hydroxide, 10 wt % phenol and the remaining 60 wt % water was used for etching of a Upilex S film at 60° C. for 10 minutes, under the same conditions described under [0039], but the polyimide film did not dissolve.

Comparative Example 6

The etching solution described in Example 6 of Japanese Unexamined Patent Publication No. 5-301981, i.e. a solution with a composition of 30 wt % sodium hydroxide, 10 wt % phenol, 20 wt % ethylenediamine and the remainder 40 wt % water was used for etching of Metaloyal films (50 micron-thick polyimide film produced by Ube Industries, Ltd., i.e. Upilex S, with an 8 micron copper foil formed on one side) with patterns formed on the copper foil surfaces, prepared in the same manner as Examples 16–19 of the present invention, at 60° C. for 7 minutes in the manner described in Example 6 of Japanese Unexamined Patent Publication No. 5-301981; however, no etching was achieved, and although the polyimide films were etched after extending the time to 30 minutes of treatment, peeling occurred between the copper foils and polyimide films, and throughholes with the prescribed shape could not be obtained.

Comparative Example 7

An etching solution was prepared as described in Example 10 of Japanese Unexamined Patent Publication No. 5-301981, i.e. with 25 wt % sodium hydroxide, 5 wt % phenol, 20 wt % ethylenediamine and the remainder 50 wt % ethanol, and the mixture formed a slurry. It was attempted to use this solution for etching of the aforementioned Metaloyal film with a copper foil pattern by immersion at 60° C. for 6 minutes under the same conditions as Example 10 of Japanese Unexamined Patent Publication No. 5-301981, but no etching was achieved, and even after 30 minutes of treatment the polyimide film still had undergone no etching.

Comparative Example 8

The solution of Example 3 of Japanese Unexamined Patent Publication No. 3-101228 which had the highest etching rate among the etching solutions of Examples 1–10 in Table 1 of Japanese Unexamined Patent Publication No. 3-101228 was used to immerse the aforementioned Metaloyal film with a copper foil pattern for 2 hours at a solution temperature of 25° C., but no throughholes were obtained.

Comparative Example 9

The etching solution of Comparative Example 8 and the Metaloyal film were used for etching at 80° C., and this resulted in peeling of the copper foil from the polyimide film by 4 minutes, before throughholes had been obtained in the polyimide.

Comparative Example 10

The etching solution described in Example 4 of Japanese Unexamined Patent Publication No. 5-202206 was prepared, i.e. an etching solution comprising 70 vol % of a 40 wt % aqueous sodium hydroxide solution, 8 vol % of hydrazine monohydrate, 22 vol % of ethylenediamine, 6 vol % of a 20 wt % aqueous dimethylamine solution and 6 vol % of N,N-dimethylformamide, and foaming occurred upon heating prior to etching, becoming more severe as the temperature increased.

The Metaloyal film with a copper foil pattern was immersed in the foaming etching solution at a solution temperature of 60° C. for attempted etching, but the polyimide film dissolved only slightly, and peeling occurred between the copper foil and the polyimide film before throughholes had been obtained. Assuming that deterioration of the etching solution components was due to the foaming with increased temperature, a new etching solution was prepared in order to attempt repeat etching, but throughholes of the desired prescribed shape and dimensions still could not be obtained without peeling of the copper foil.

As explained above, according to the present invention it is possible to achieve etching of not only polyimide resins obtained by polycondensation of pyromellitic dianhydride and aromatic diamines, but also polyimide resins obtained by polycondensation of biphenyltetracarboxylic dianhydride and diaminobenzene, and there is provided a widely applicable resin etching solution as well as an etching process which is suitable for etching of many different forms of resins, and especially polyimide films.

In addition, when etching it is possible to achieve an economical etching rate while preventing destruction of etching hole patterns (flawed shape and dimensions), and to further reduce the degree of tapering of etching holes and achieve smoother sides (hole walls).

What is claimed is:

1. A resin etching solution consisting of a hydroxyalkylamine, an alkali metal compound and water, wherein the etching solution is capable of etching a polyimide film.

2. A resin etching solution according to claim 1, wherein the hydroxyalkylamine is selected from the group consisting of primary and secondary amines and mixtures thereof.

3. A resin etching solution according to claim 1, wherein the alkali metal compound is selected from the group consisting of potassium, sodium and lithium hydroxides and mixtures thereof.

4. A process for etching a polyimide film comprising etching a polyimide film comprising a resist pattern or metal layer pattern formed on either or both sides using a resin etching solution according to claim 1.

5. A process for etching a polyimide film according to claim 4, wherein the polyimide film is etched with irradiation of ultrasonic waves while being immersed in the resin etching solution.

6. A process for etching a polyimide film according to claim 4, wherein the polyimide film is etched by spraying the resin etching solution through a spray nozzle.

7. A resin etching solution comprising a hydroxyalkylamine, an alkali metal compound and water, wherein the etching solution is capable of etching a polyimide film.

8. A resin solution according to claim 7, which further comprises at least one of urea and an organic polar solvent.

9. A resin solution according to claim 7, wherein the hydroxyalkylamine is selected from the group consisting of primary and secondary amines and mixtures thereof.

10. A resin solution according to claim 7, wherein the alkali metal compound is selected from the group consisting of potassium, sodium, lithium and mixtures thereof.

* * * * *